(12) United States Patent
Matsushima

(10) Patent No.: US 7,598,604 B2
(45) Date of Patent: Oct. 6, 2009

(54) LOW PROFILE SEMICONDUCTOR PACKAGE

(75) Inventor: Ryoji Matsushima, Yokkaichi (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 365 days.

(21) Appl. No.: 11/551,082

(22) Filed: Oct. 19, 2006

(65) Prior Publication Data
US 2007/0102762 A1 May 10, 2007

(30) Foreign Application Priority Data
Oct. 24, 2005 (JP) .............................. 2005-308358

(51) Int. Cl.
*H01L 23/06* (2006.01)
*H01R 9/00* (2006.01)

(52) U.S. Cl. ................ 257/684; 257/686; 257/687; 257/690; 257/777; 257/784; 257/E23.031; 257/E23.042; 361/772; 361/774; 361/813

(58) Field of Classification Search ................ None
See application file for complete search history.

(56) References Cited
U.S. PATENT DOCUMENTS 5,723,903 A * 3/1998 Masuda et al. ............. 257/696
6,133,637 A * 10/2000 Hikita et al. ................ 257/777
6,303,981 B1 * 10/2001 Moden ...................... 257/666
6,380,615 B1    4/2002 Park et al.
6,476,474 B1 * 11/2002 Hung ......................... 257/686
6,552,437 B1 *  4/2003 Masuda et al. ............. 257/777
6,555,917 B1    4/2003 Heo
6,677,674 B2 *  1/2004 Nagao ....................... 257/724
6,750,080 B2 *  6/2004 Masuda et al. ............. 438/106
6,955,941 B2   10/2005 Bolken
2002/0027266 A1 *  3/2002 Wada et al. ................ 257/666
2005/0110127 A1 *  5/2005 Kanemoto et al. ......... 257/686

FOREIGN PATENT DOCUMENTS

JP   2001-36000    2/2001
KR   2002-0061444  7/2002

* cited by examiner

*Primary Examiner*—Alonzo Chambliss
(74) *Attorney, Agent, or Firm*—Oblon, Spivak, McClelland, Maier & Neustadt, L.L.P.

(57) ABSTRACT

A first semiconductor element and a second semiconductor element each have an electrode forming surface with an electrode pad thereon. The first semiconductor element and the second semiconductor element are stacked to expose each electrode pad and bonded while facing the electrode forming surfaces each other. The electrode pads of the first and second semiconductor elements are connected to the first and second connection terminals via bonding wires. A metal circuit board including the first and second connection terminals, and the first and second semiconductor elements are sealed by a sealing material such that parts of the respective connection terminals expose.

16 Claims, 14 Drawing Sheets

LOW PROFILE SEMICONDUCTOR PACKAGE

CROSS-REFERENCE TO THE INVENTION

This application is based upon and claims the benefit of priority from the prior Japanese Patent Application No. 2005-308358, filed on Oct. 24, 2005; the entire contents of which are incorporated herein by reference

BACKGROUND OF THE INVENTION

1. Field of the Invention

The present invention relates to a semiconductor device, and a semiconductor package and a circuit device using the same.

2. Description of the Related Art

In recent years, in order to realize downsizing and high density packaging of a semiconductor device, a stacked multichip package in which a plurality of semiconductor elements are stacked and sealed in a single package is practically used. In such a stacked multichip package, the plurality of semiconductor elements is stacked sequentially on a wiring substrate or a lead frame. The plurality of semiconductor elements are connected to connection terminals of the wiring substrate or the lead frame via bonding wires, respectively. Therefore, the plurality of semiconductor elements are stacked in the same vertical direction.

In a conventional stacked multichip package, a bonding wire connected to an uppermost semiconductor element inevitably passes through a portion over the thickness of stacked multiple semiconductor elements. Accordingly, a sealing resin is required to have an additional thickness to the extent of the shape of the bonding wire. The conventional stacked multichip package has a package base such as the wiring substrate, the lead frame, or the like as an indispensable component. The thickness of this package base is also a factor to increase the thickness of the stacked multichip package (semiconductor package) as well.

Further, in the conventional stacked multichip package, reliability assessment test such as Burn-In test is made after manufacturing the package (after sealing with resin). Therefore, even when a single semiconductor element composing the multichip package has an initial failure or a process failure, the entire package results in failure. The yield of the semiconductor package downs exponentially with the stacked number to the base being each yield of the semiconductor elements.

In JP-A 2001-036000 (KOKAI), there is described a semiconductor package in which two semiconductor elements are arranged such that their surfaces on which a bonding pad is formed respectively face each other. However, there, insulating layers are formed on such surfaces of the respective semiconductor elements as to form the bonding pads and further metal wirings are formed on the surfaces of the respective insulating layers, in which these metal wirings are connected via solder balls. Therefore, it is impossible to reduce the thickness of the semiconductor package itself sufficiently. In addition, the connection between a mounting board and the semiconductor package is established by arranging a bonding wire in a space between the two semiconductor elements. Also from this viewpoint, the thickness of the semiconductor device tends to increase.

SUMMARY OF THE INVENTION

A semiconductor device according to an embodiment of the present invention includes: a first semiconductor element including an electrode forming surface having a first electrode pad thereon; a second semiconductor element including an electrode forming surface having a second electrode pad thereon, and stacked and bonded to the first semiconductor element while facing the electrode forming surfaces each other so that the first and second electrode pads expose, respectively; a metal circuit board having a first connection terminal and a second connection terminal arranged outside the first and second semiconductor elements, the first connection terminal connecting to the first electrode pad via a first bonding wire and the second connection terminal connecting to the second electrode pad via a second bonding wire; and a sealing material sealing the first and second semiconductor elements and the metal circuit board so that parts of the first and second connection terminals expose.

A semiconductor package according to another embodiment of the present invention includes: a package base including a semiconductor device mounting portion, connection pads arranged around the semiconductor device mounting portion, and mounting terminals electrically connected to the connection pads; a semiconductor device mounted on the mounting portion of the package base and including a first semiconductor having an electrode forming surface with an first electrode pad thereon, a second semiconductor element having an electrode forming surface with a second electrode pad thereon, and stacked and bonded to the first semiconductor element while facing the electrode forming surfaces each other so that the first and second electrode pads expose, respectively, a metal circuit board having a first connection terminal and a second connection terminal arranged outside the first and second semiconductor elements, the first connection terminal connecting to the first electrode pad via a first bonding wire and the second connection terminal connecting to the second electrode pad via a second bonding wire, and a first sealing material sealing the first and second semiconductor elements and the metal circuit board so that parts of the first and second connection terminals expose; a connection portion electrically connecting the connection pads of the package base and the first and second connection terminals of the semiconductor device; and a second sealing material sealing the semiconductor device.

A circuit device according to still another embodiment of the present invention includes: a mounting board including mounting pads; a semiconductor device mounted on the mounting board and including a first semiconductor element having an electrode forming surface with an electrode pad thereon, a second semiconductor element having an electrode forming surface with a second electrode pad thereon, and stacked and bonded to the first semiconductor element while facing the electrode forming surfaces each other so that the first and second electrode pad expose, respectively, a metal circuit board having a first connection terminal and a second connection terminal arranged outside the first and second semiconductor elements, the first connection terminal connecting to the first electrode pad via a first bonding wire and the second connection terminal connecting to the second electrode pad via a second bonding wire, and a sealing material sealing the first and second semiconductor elements and the metal circuit board so that parts of the first and second connection terminals expose; and a connection portion electrically connecting the mounting pads of the mounting board and the first and second connection terminals of the semiconductor device.

DESCRIPTION OF THE EMBODIMENTS

Hereinafter, embodiments according to the present invention will be described with reference to the drawings. Note that the embodiments according to the present invention will be described hereinafter with reference to the drawings, however, those drawings are provided for the purpose only of illustration and the present invention is not limited to the drawings.

Figure 1:
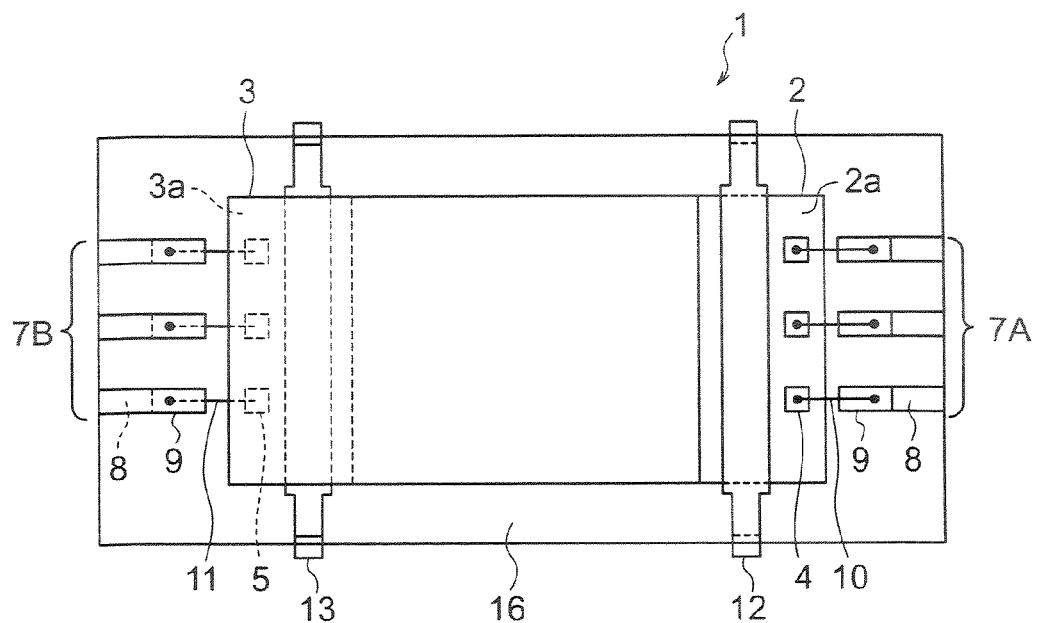
FIG. 1 is a plan view showing a structure of a semiconductor device according to a first embodiment of the present invention.
Figure 2:
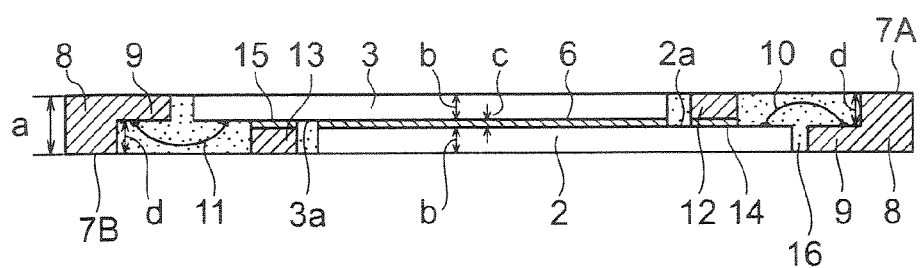
FIG. 2 is a sectional view of the semiconductor device shown in FIG. 1.

FIG. 1 and FIG. 2 are views showing the structure of a semiconductor device according to a first embodiment of the present invention, in which FIG. 1 is a plan view and FIG. 2 is a sectional view. A semiconductor device 1 shown in these drawings includes a first semiconductor element 2 and a second semiconductor element 3. The first semiconductor element 2 includes a first electrode pad 4 formed on a main surface 2a on one side thereof. The main surface 2a of the first semiconductor element 2 is an electrode forming surface.

Similarly, a second semiconductor element 3 also includes a second electrode pad 5 formed on a main surface 3a on one side thereof. The main surface 3a of the second semiconductor element 3 is an electrode forming surface. The first and second electrode pads 4, 5 are arranged on one end portion side of the first and second semiconductor elements 2, 3, respectively. For the first and second semiconductor elements 2, 3, for example, a memory element such as a NAND type flash memory is applied. However, they are not limited thereto.

The first and second semiconductor elements 2, 3 are stacked such that the electrode forming surfaces 2a, 3a face each other while the first and second electrode pads 4, 5 position at opposite end portions thereof. Further, the electrode forming surfaces 2a, 3a of the first and second semiconductor elements 2, 3 are bonded to each other via an adhesive layer 6. In order to bond the electrode forming surfaces 2a, 3a of the first and second semiconductor elements 2, 3, the first and second semiconductor element 2, 3 are stacked while shifting their center portions so that the electrode pads 4, 5 expose, respectively.

Specifically, the first semiconductor element 2 is arranged in a misaligned manner with respect to the second semiconductor element 3 so that the second semiconductor element 3 does not cover the electrode pad 4. As a result, the first electrode pad 4 of the first semiconductor element 2 stacked with the second semiconductor element 3 expose upward. This is equally true for the second semiconductor element 3, and the second electrode pads 5 of the second semiconductor element 3 exposes downward on the opposite side to the first electrode pads 4.

Thus, since the stacking positions of the first and second semiconductor element 2, 3 are shifted, the respective electrode pads 4, 5 are exposed while the electrode forming surfaces 2a, 3a are bonded. Further, even when the thickness of the first and second semiconductor elements 2, 3 stacked (including the thickness of the adhesive layer 6) is defined to be the maximum thickness when configuring the package, a space corresponding to the thickness of the second semiconductor element 3 produces on of the first electrode pad 4. Similarly, a space corresponding to the thickness of the first semiconductor element 2 also produces in an upper side (lower side in the drawing) of the second electrode pad 5.

Outside the first and second semiconductor elements 2, 3 of which electrode forming surfaces 2a, 3a are bonded each other, a metal circuit board 7 are arranged. The metal circuit board 7 is formed, for example, by copper alloy, iron nickel alloy or the like. The metal circuit board 7A arranged outside an electrode-side end portion of the first semiconductor element 2 composes a first connection terminal to be connected to the first semiconductor element 2. The metal circuit board 7B arranged outside an electrode-side end portion of the second semiconductor element 3 composes a second connection terminal to be connected to the second semiconductor element 3.

Each of the first and second connection terminals 7A, 7B has a stepped shape by reducing the thickness of a part of a metal board so that an outside connection terminal 8 and an inside connection terminal 9 are formed based on the stepped shape. Specifically, each of the first and second connection terminals 7A, 7B has the outside connection terminal 8 at a portion having the original thickness (thicker portion) of the stepped shape. Further, the inside connection terminal 9 is formed at a portion being reduced in thickness in a stepped manner and continued from the outside connection terminal 8 corresponding to the thicker portion. The inside connection terminals 9 of these connection terminals 7A, 7B are reduced in thickness to have a space, respectively, in the same direction as of the electrode pads 4, 5 connected thereto.

Specifically, the inside connection terminal 9 of the first connection terminal 7A is reduced in thickness in a stepped manner while it is continued from the outside connection terminal 8 so that a terrace portion of a stepped shape is formed in the exposing direction (upper direction in the drawing) of the first electrode pad 4. Similarly, the inside connection terminal 9 of the second connection terminal 7B is reduced in thickness in the stepped manner while it is continued from the outside connection terminal 8 so that the terrace portion of the stepped shape is formed in the exposing direction (lower direction in the drawing) of the second electrode pad 5.

The inside connection terminal 9 of the first connection terminal 7A has the space formed in the same direction (upper direction in the drawing) as of the first electrode pad 4. Similarly, the inside connection terminal 9 of the second connection terminal 7B has the space formed in the same direction (lower direction in the drawing) as of the second electrode pad 5. The terrace portions of the inside connection terminals 9 of the first and second connection terminals 7A, 7B are oriented in the same direction as of the first and second electrode pads 4, 5, respectively. Further, the first and second connection terminals 7A, 7B are arranged such that their terrace portions each composing the inside connection terminal 9 are in the opposite direction to each other.

The connection terminals 7A, 7B each having the stepped shape are manufactured, for example, as described below. Specifically, in order to form the inside connection terminal 9, half-etching or coining is performed to such a portion of the metal circuit board 7 that corresponds to the outside connection terminal 8 and has the original thickness. In this manner, the connection terminals 7A, 7B each having the outside connection terminal 8 and inside connection terminal 9 are manufactured.

The original thickness of the metal circuit board 7 is set in accordance with the thickness of the stacked first and second semiconductor elements 2, 3 (including the thickness of the adhesive layer 6). Specifically, when the thickness of the outside connection terminal 8, the respective thicknesses of the first and second semiconductor elements 2, 3, and the thickness of the adhesive layer 6 are defined as "a", "b", and "c", respectively, the thickness "a" of the metal circuit board 7 corresponding to the thickness of the outside connection terminal 8 satisfies the condition: $a \geqq 2b+c$.

When performing a process such as the half-etching, coining, or the like to such portion of the metal circuit board 7 that has the original thickness so as to form the inside connection terminals 9, the amount "d" of the half-etching or coning preferably satisfies the condition: $d \geqq b+c$. With this, for the inside connection terminals 9 of the first and second connection terminals 7A, 7B, the spaces each having at least a thickness corresponding to the sum (b+c) of the thickness "b" of the semiconductor elements 2, 3 and the thickness "c" of the adhesive layer 6 are formed in the portions removed by the half-etching, coining, or the like. Plating such as of Ag, Au, or the like is performed to these outside connection terminals 8 and inside connection terminals 9 to use them as the first and second connection terminals 7A, 7B, respectively.

The electrode pads 4, 5 of the first and second semiconductor elements 2, 3 and the inside connection terminals 9 of the first and second connection terminals 7A, 7B are electrically connected via bonding wires 10, 11 respectively arranged in the portions (spaces) removed by the half-etching, coining, or the like. Specifically, the first bonding wire 10 is accommodated in the space corresponding to the sum (b+c) of the thickness "b" of the second semiconductor element 3 and the thickness "c" of the adhesive layer 6. Similarly, the second bonding wire 11 is accommodated in the space corresponding to the sum (b+c) of the thickness "b" of the first semiconductor element 2 and the thickness "c" of the adhesive layer 6.

In this manner, the first and second semiconductor elements 2, 3 are connected to the inside connection terminals 9 of the first and second connection terminals 7A, 7B via the first and second bonding wires 10, 11 accommodated within the total thickness of the stacked first and second semiconductor elements 2, 3, respectively. By accommodating the first and second bonding wires 10, 11 within the total thickness of the stacked first and second semiconductor elements 2, 3, the thickness of the semiconductor device 1 can be reduced as compared to the conventional devices.

Further, each of the first and second semiconductor elements, 2, 3 is supported by a die pad portion 12 or 13 formed as a part of the metal circuit board 7. A first die pad portion 12 is reduced in thickness by the half-etching, coining, or the like from the direction opposite to the inside connection terminal 9 of the first connection terminal 7A and bonded to the electrode forming surface 2a of the first semiconductor element 2 via an adhesive layer 14. Similarly, a second die pad portion 13 is reduced in thickness by the half-etching, coining, or the like from the direction opposite to the inside connection terminal 9 of the second connection terminal 7B and bonded to the electrode forming surface 3a of the second semiconductor element 3 via an adhesive layer 15. The first and second die pad portions 12, 13 are arranged at a position not hindering the electrode pads 4, 5 of the semiconductor elements 2, 3, respectively.

The first and second die pad portions 12, 13 can be formed by the half-etching, coining, or the like at the same time of forming the inside connection terminals 9. When the first and second semiconductor elements 2, 3 have the same shape, the thickness reduction by the half-etching, coining, or the like is preferably performed from both the sides and symmetrically with respect to a point in accordance with the inside connection terminals 9 and the die pad portions 12, 13. The first and second semiconductor elements 2, 3 and the metal circuit boards 7 (first and second connection terminals 7A, 7B) are sealed thereafter with a sealing material such as a sealing resin 16 such that parts of the respective outside connection terminals 8 are exposed, whereby the semiconductor device 1 according to the present embodiment is constituted.

Figure 3A:
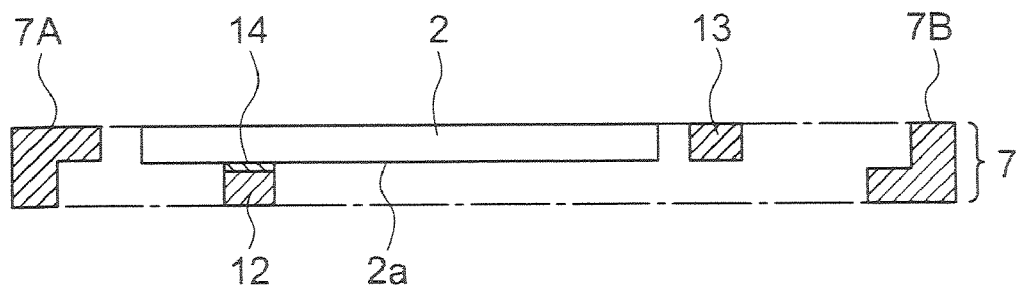
FIGS. 3A, 3B, 3C are sectional views showing a production process of the semiconductor device shown in FIG. 1 in which steps up to stack a first semiconductor element and a second semiconductor element are shown.
Figure 3B:
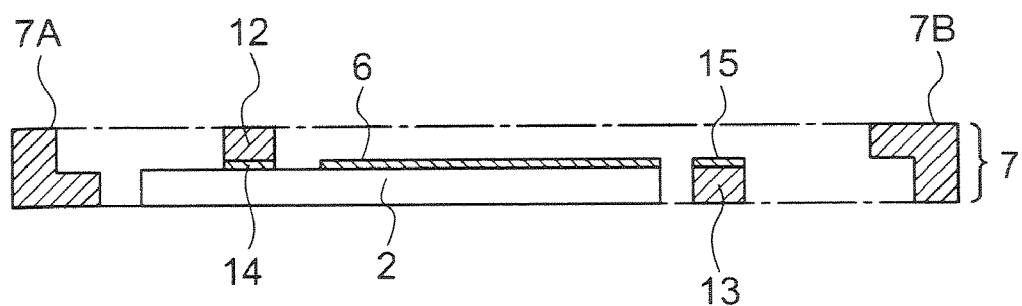

The semiconductor device 1 according to the present embodiment is manufactured, for example, as described below. The description will be given of the production process of the semiconductor device 1 with reference to FIGS. 3A to 3C, 4A to 4C, 5A to 5C, and 6A to 6C. First, as shown in FIGS. 3A and 4A, the metal circuit board 7 having the first and second connection terminals 7A, 7B and the first and second die pad portions 12, respectively, is prepared. As a metal circuit board 7, for example, a lead frame 17 as shown, for example, in FIG. 7 can be used. The lead frame 17 shown in FIG. 7 is structured to have four continuous device forming regions each having the connection terminals 7A, 7B and die pad portions 12, 13 in a unified manner.

Figure 4A:
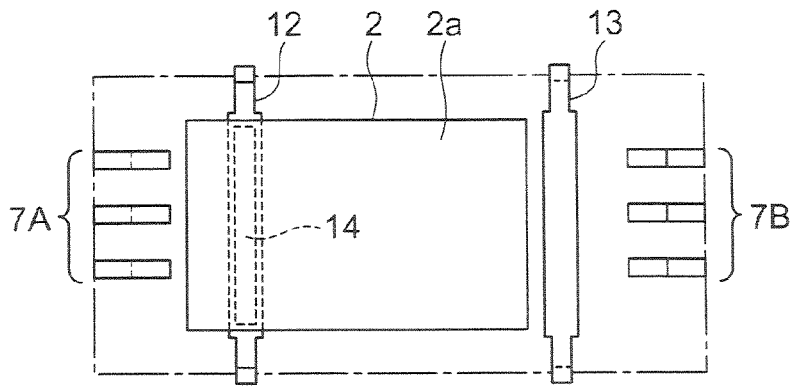
FIGS. 4A, 4B, 4C are plan views showing the production process of the semiconductor device shown in FIGS. 3A, 3B, 3C.
Figure 4B:
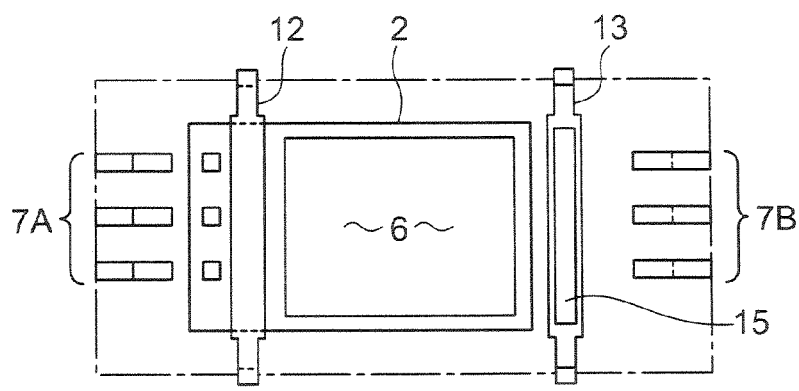

On the first die pad portion 12 of the above-described metal circuit board 7 (lead frame 17), an insulative die attach resin or the like is arranged as an adhesive layer 14, and after that, the first semiconductor element 2 is be bonded thereto (FIGS. 3A and 4A). The first semiconductor element 2 is arranged so that the electrode forming surface 2a thereof is bonded to the first die pad portion 12. Subsequently, the metal circuit board 7 having the first semiconductor element 2 bonded thereto is reversed as shown in FIGS. 3B and 4B, and after that, the insulative die attach resin or the like is arranged on the first semiconductor element 2 and the second die pad portion 13 as adhesive layers 6, 15, respectively.

Figure 3C:
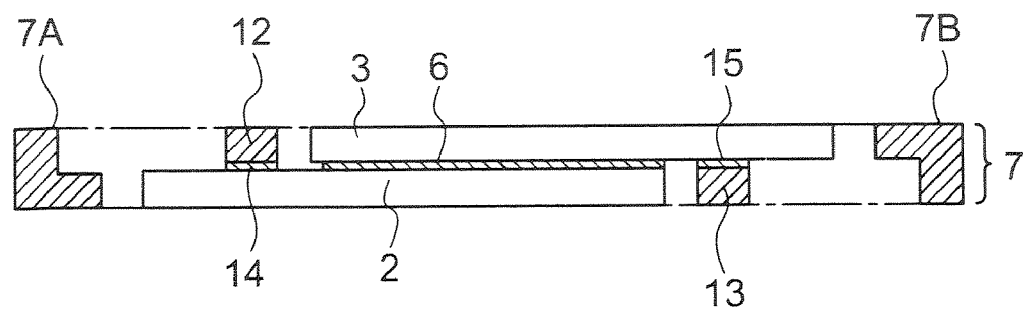
Figure 4C:
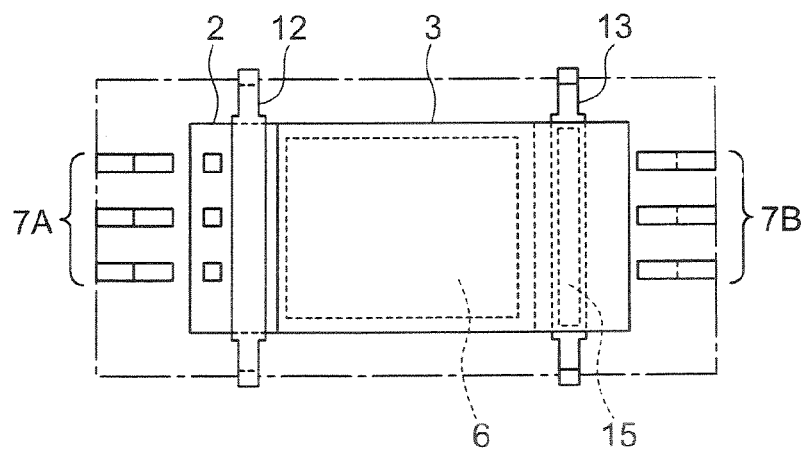
Figure 5A:
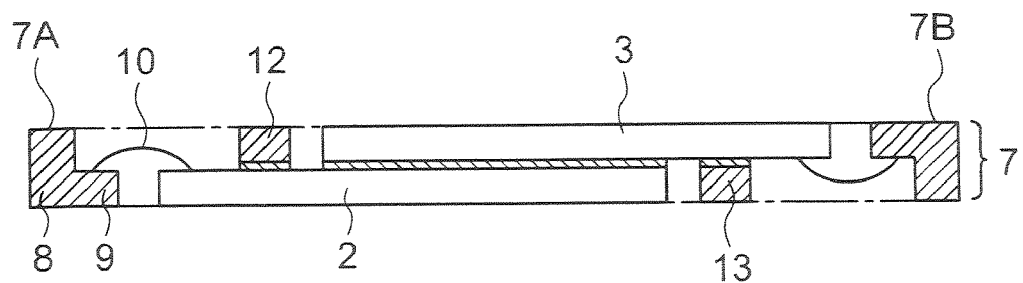
FIGS. 5A, 5B, 5C are sectional views showing the production process of the semiconductor device shown in FIG. 1 in which steps up to seal the first and second semiconductor elements are shown.
Figure 5B:
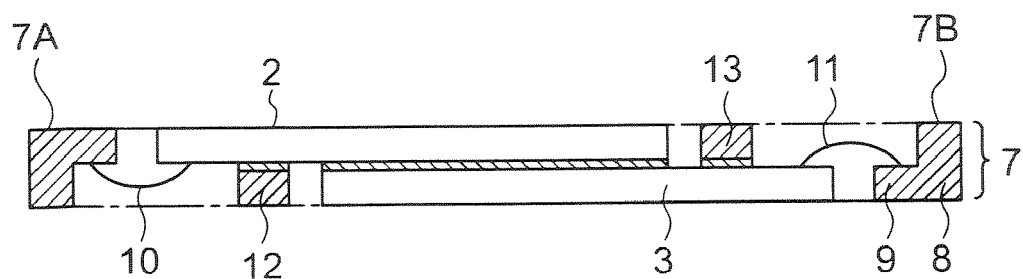
Figure 6A:
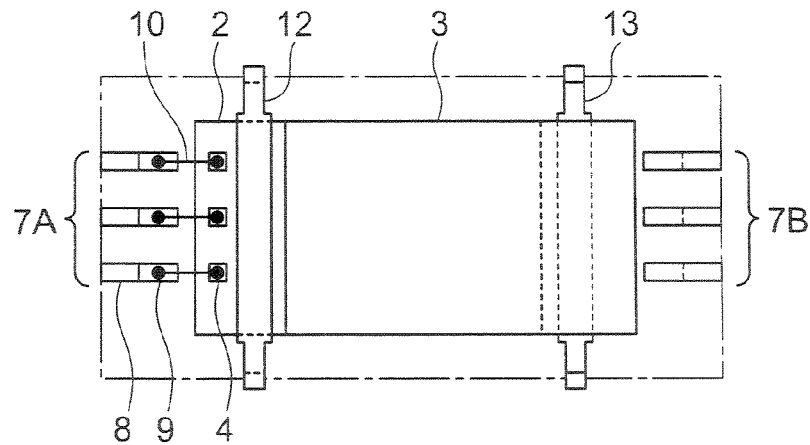
FIGS. 6A, 6B, 6C are plan views showing the production process of the semiconductor device shown in FIGS. 5A, 5B, 5C.
Figure 6B:
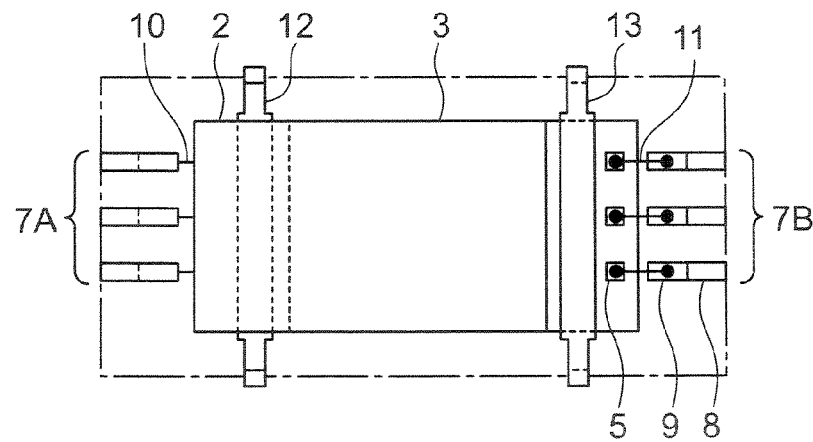

Subsequently, as shown in FIGS. 3C and 4C, the second semiconductor element 3 is bonded to the first semiconductor element 2 in a misaligned manner therewith. The second semiconductor element 3 is bonded to the first semiconductor element 2 and the second die pad portion 13 via the adhesive layers 6, 15. Subsequently, as shown in FIGS. 5A and 6A, wire bonding is performed to the first semiconductor element 2. Further, as shown in FIGS. 5B and 6B, the metal circuit board 7 is reversed and the wire bonding is performed to the second semiconductor element 3. In this manner, the respective electrode pads 4, 5 of the first and second semiconductor elements 2, 3 and the respective inside connection terminals 9 of the first and second connection terminals 7A, 7B are connected via the bonding wires 10, 11, respectively.

Figure 5C:
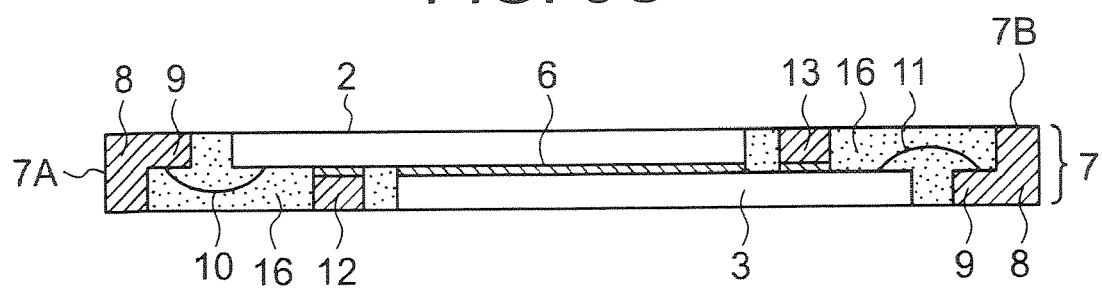
Figure 6C:
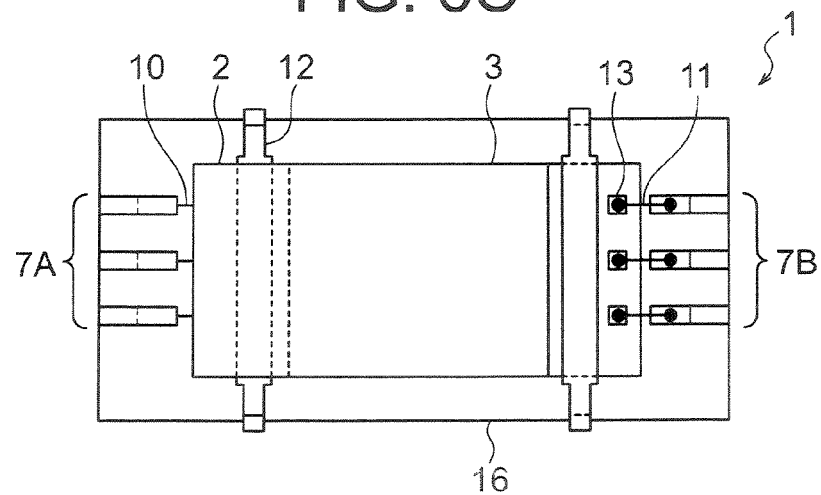
Figure 7:
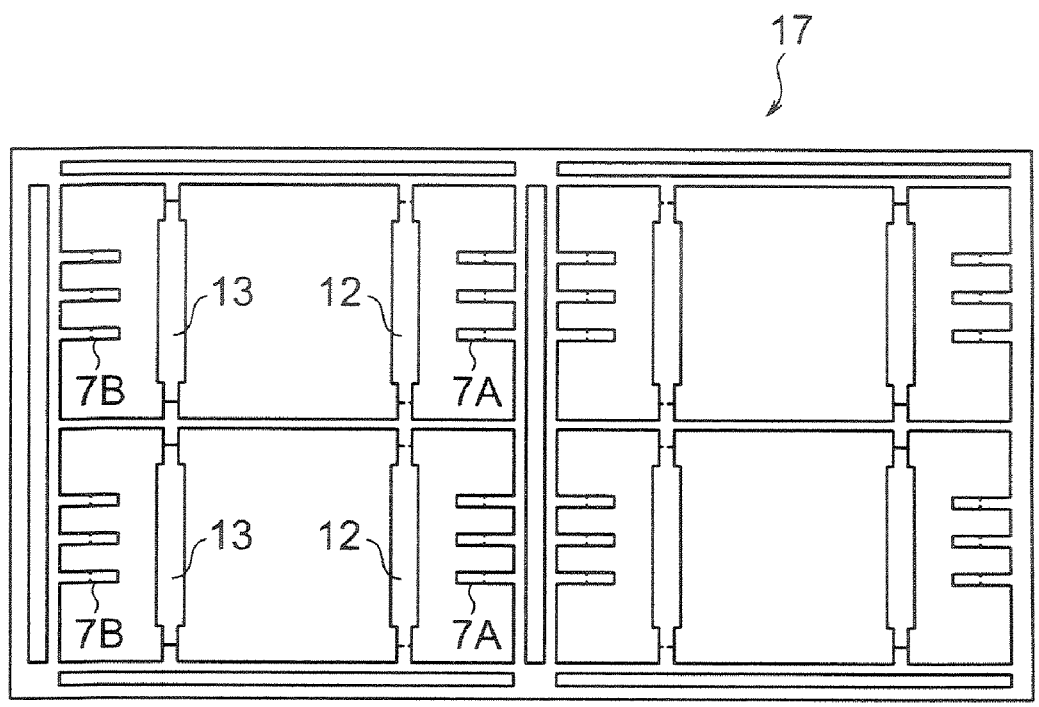
FIG. 7 is a plan view showing an example structure of a lead frame used in the production process of the semiconductor device according to the first embodiment of the present invention.

After that, as shown in FIGS. 5C and 6C, the first and second semiconductor elements 2, 3 and metal circuit board 7 (first and second connection terminals 7A, 7B) are injection molded, for example, by the sealing resin (molding resin) 16. At this time, the molding is performed with the sealing resin 16 such that the respective outside connection terminals 8 of the connection terminals 7A, 7B expose. Thus, by sealing the first and second semiconductor elements 2, 3 and the first and second connection terminals 7A, 7B with the sealing resin 16, and after that, by cutting off the respective connection terminals 7A, 7B and the die pad portions 12, 13, respectively from the lead frame 17, the semiconductor device 1 according to the present embodiment is manufactured.

In the semiconductor device 1 of the first embodiment, the two semiconductor elements 2, 3 are arranged in a mutually misaligned manner, and at the same time, stacked such that the respective electrode forming surfaces 2a, 3a face each other, so that the respective electrode pads 4, 5 expose. Accordingly, the wire bonding can be realized to the semiconductor elements 2, 3 within the total thickness of the stacked two semiconductor elements 2, 3. Further, the respective connection terminals 7A, 7B are formed to have a stepped shape by reducing the thickness thereof in the same direction as the exposing direction of the electrode pads 4, 5, so that the bonding wires 10, 11 connecting the electrode pads 4, 5 and the inside connection terminals 9 can be easily accommodated within the total thickness of the stacked semiconductor elements 2, 3.

The connection terminals 7A, 7B have the outside connection terminals 8, respectively, and at the same time, the connection terminals 7A, 7B and the semiconductor elements 2, 3 are sealed with the sealing resin 16 except parts of these outside connection terminals 8. The semiconductor device 1 as described above can be used directly as a semiconductor package. Accordingly, the semiconductor device 1 having a package structure of a reduced thickness can be provided. To illustrate, when the semiconductor elements 2, 3 of a thickness of 60 μm are bonded with the adhesive layer 6 of a thickness of 20 μm, the thickness of the semiconductor device (semiconductor package) 1 can be suppressed to approximately 150 μm at maximum. The two semiconductor elements 2, 3 are symmetrical to each other in the thickness direction, so that a curve or the like in no case arises due to the difference in heat conductivity between the component materials of the package.

Further, according to the semiconductor device 1 of the present embodiment, reliability assessment such as Burn-In test can be performed to the two semiconductor elements 2, 3 stacked and packaged. In the Burn-In test, the larger the number of stacked semiconductor elements increases, the lower the yield as a semiconductor package becomes. On the other hand, by performing the Burn-In test to the semiconductor device (semiconductor package) 1 having the two semiconductor elements, the yield down due to the number of stacked elements can be prevented. In other words, it is possible to provide the semiconductor device 1 allowing the Burn-In test to be performed for an efficient number of stacked elements in terms of yield.

Figure 8:
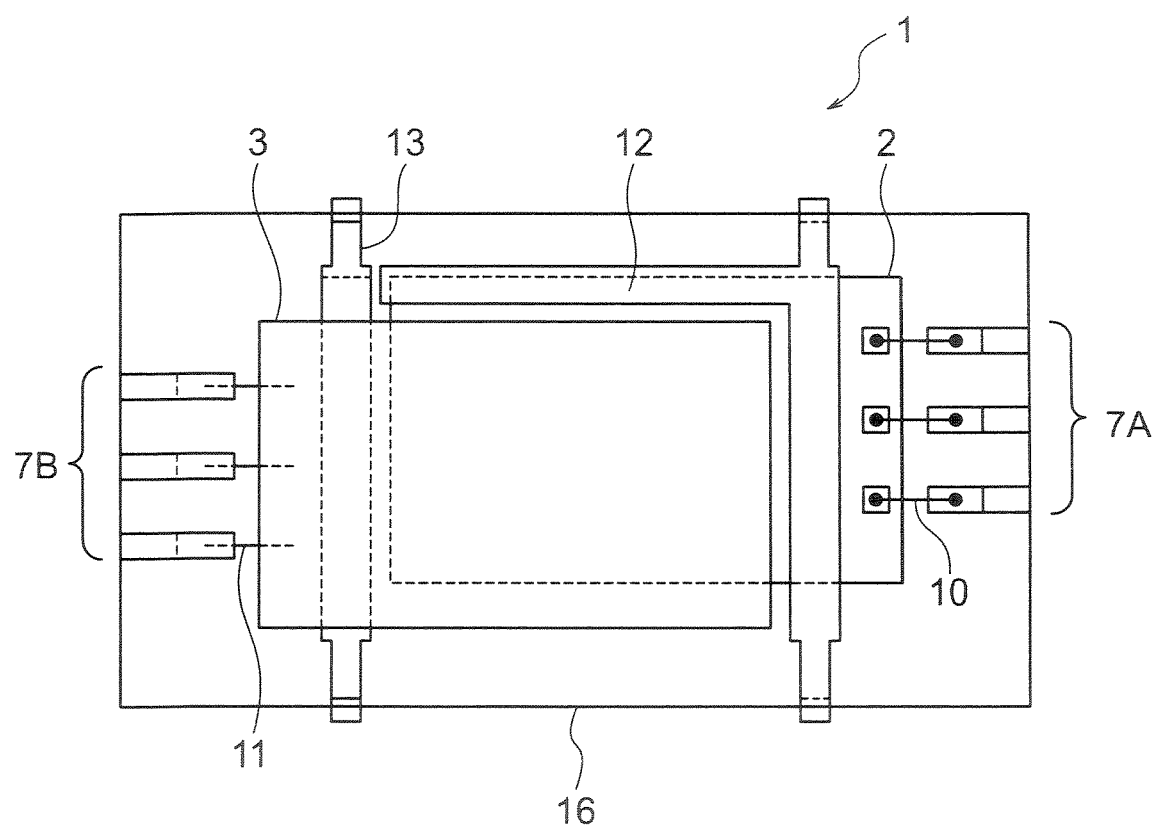
FIG. 8 is a plan view showing a modification example of the semiconductor device shown FIG. 1.
Figure 9:
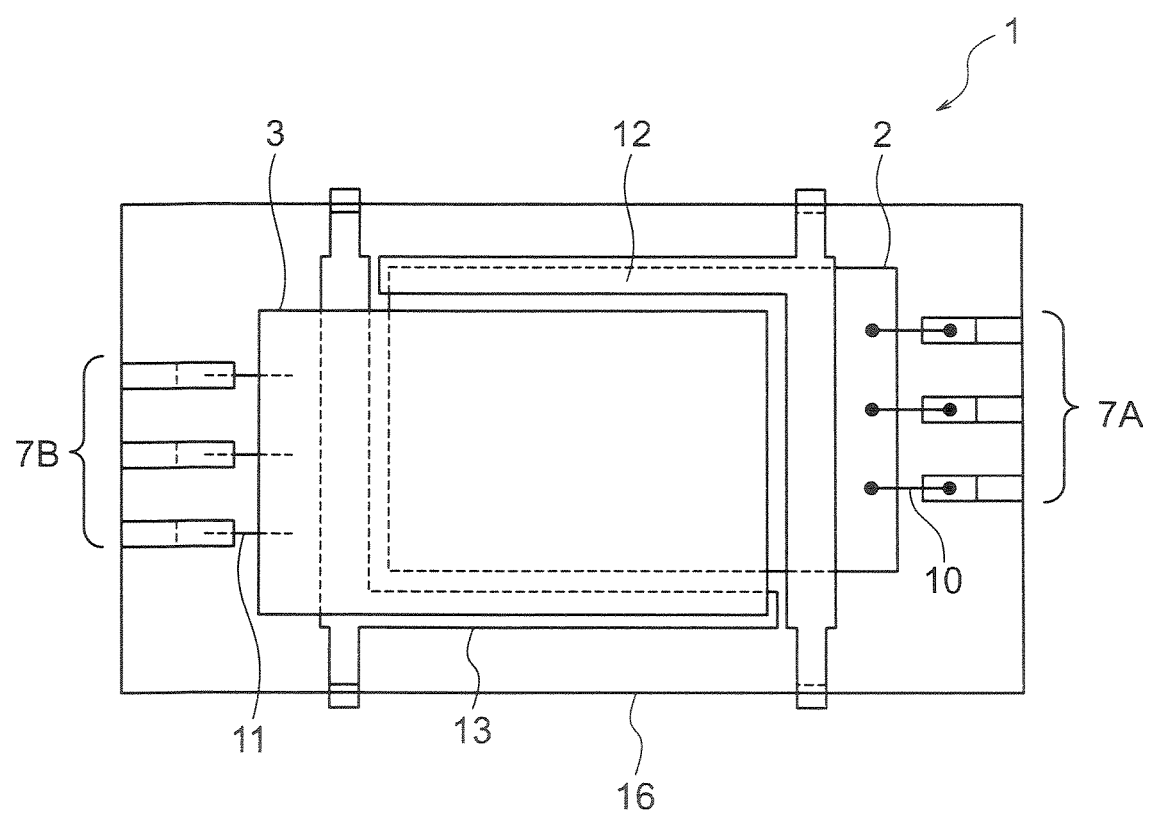
FIG. 9 is a plan view showing another modification example of the semiconductor device shown FIG. 1.

Here, in the above-described embodiment, as shown in FIGS. 3A and 4A, the first die pad portion 12 supports only the short side of the first semiconductor element 2. In this case, in the transportation in the production process of the semiconductor device 1, a failure possibly arises in the supporting structure of the first semiconductor element 2 on a case-by-case basis. In this respect, for example shown in FIG. 8, the first die pad portion 12 of an L-shape is effectively applicable. With the first die pad portion 12 of the L-shape, both the short and long sides of the first semiconductor element 2 are supported together, so that the supporting failure of the first semiconductor element 2 can be prevented effectively. As shown in FIG. 9, it is also effective to use the first and second die pad portions 12, 13 both having the L-shape.

Subsequently, the description will be given of a semiconductor device according to a second embodiment of the present invention with reference to FIG. 10 to FIG. 13 and FIGS. 14A to 14C. A semiconductor device 20 shown in these drawings adopts a thin-type lead frame for the metal circuit board. Note that the same numerical references are used to denote the same portions as of the first embodiment, and the description thereof is omitted partially.

Figure 10:
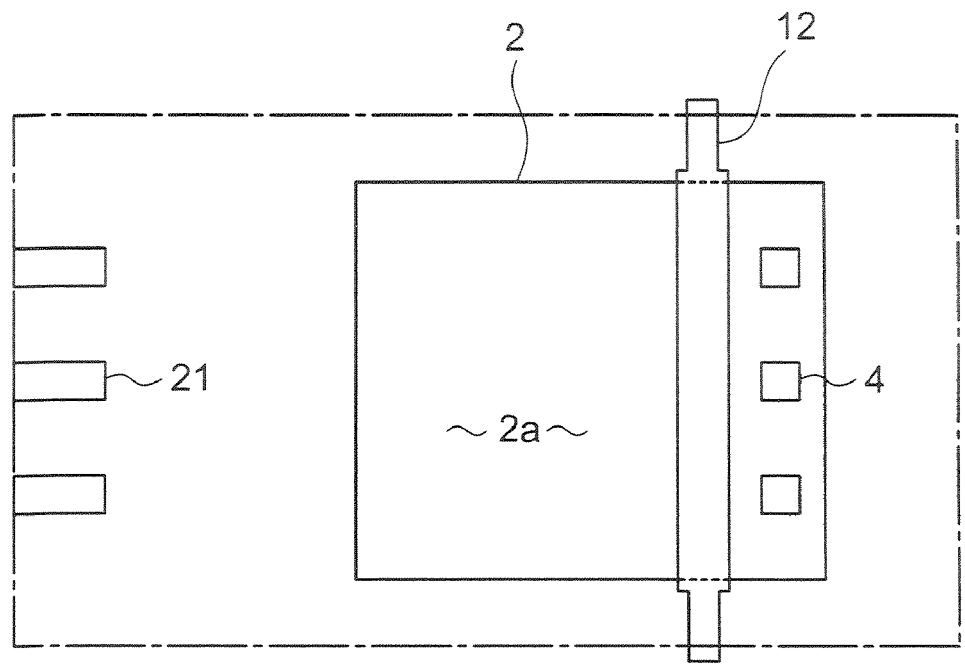
FIG. 10 is a plan view showing a first metal circuit board and a first semiconductor element attached thereto which are used in a semiconductor device according to a second embodiment of the present invention.
Figure 11:
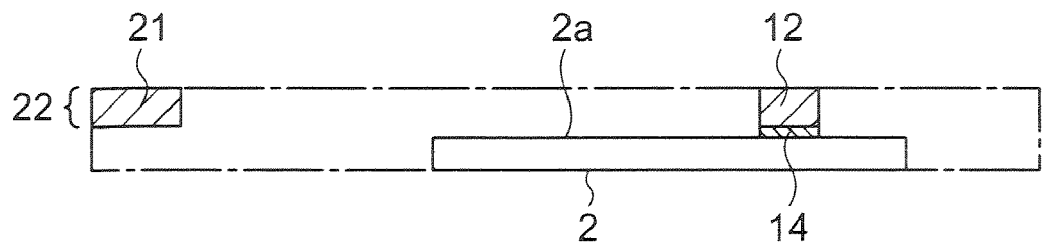
FIG. 11 is a sectional view of the first metal circuit board and the first semiconductor element shown in FIG. 10.
Figure 12:
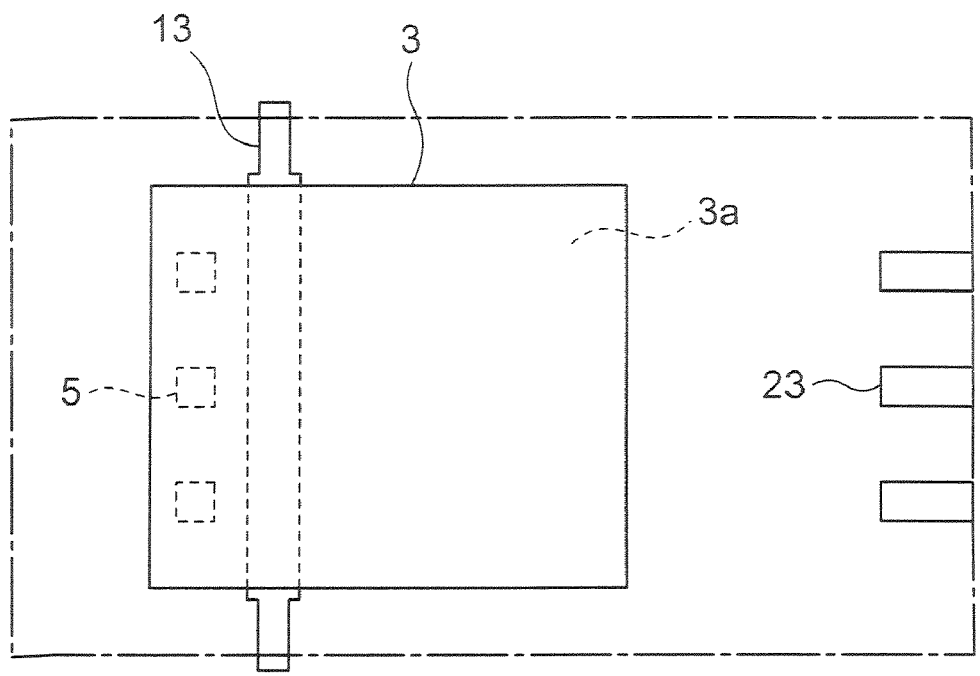
FIG. 12 is a plan view showing a second metal circuit board and a second semiconductor element attached thereto which are used in the semiconductor device according to the second embodiment of the present invention.
Figure 13:
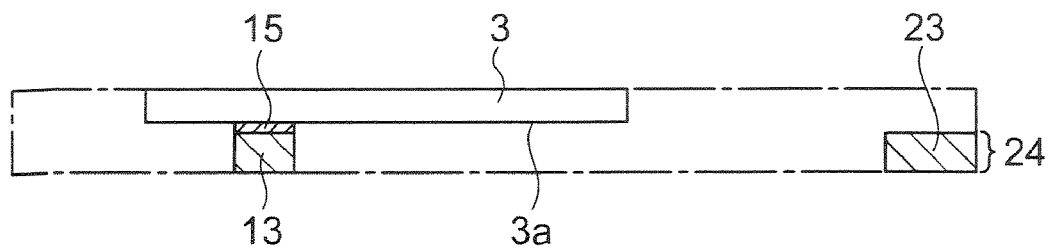
FIG. 13 is a sectional view of the second metal circuit board and the second semiconductor element shown in FIG. 12.
Figure 14A:
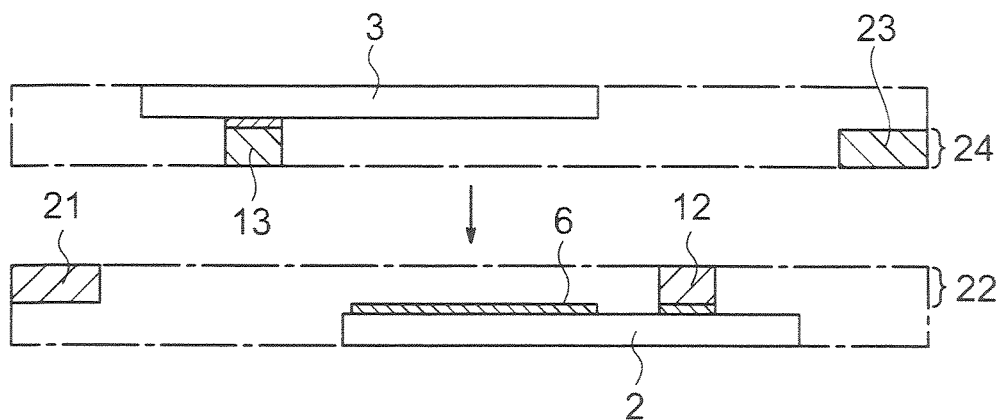
FIGS. 14A, 14B, 14C are sectional views showing a structure and a production process of the semiconductor device according to the second embodiment of the present invention.
Figure 14B:
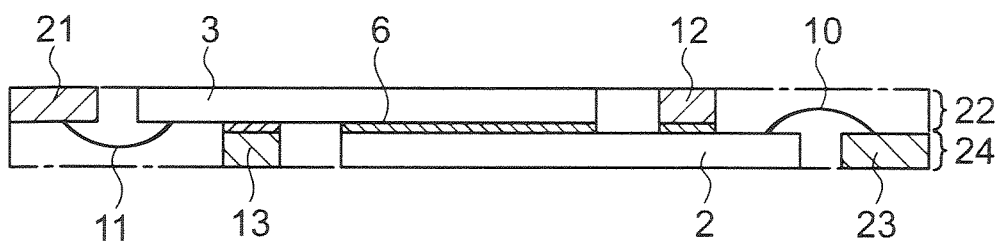
Figure 14C:
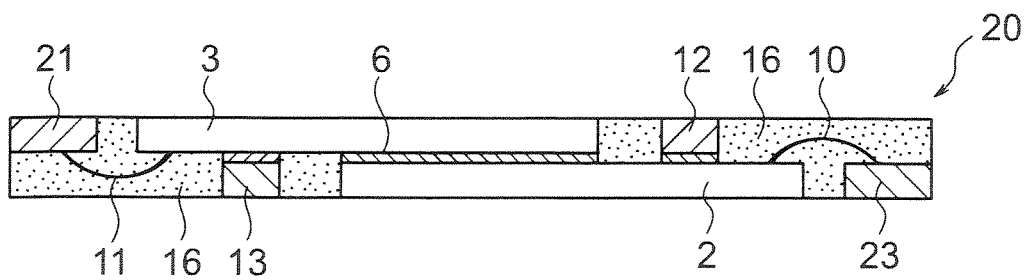

FIG. 10 and FIG. 11 show a first metal circuit board 22 having the first die pad portion 12 supporting the electrode forming surface 2a of the first semiconductor element 2 and a second connection terminal 21 to be connected to the second semiconductor element 3. FIG. 12 and FIG. 13 show a second metal circuit board 24 having the second die pad portion 13 supporting the electrode forming surface 3a of the second semiconductor element 3 and a first connection terminal 23 to be connected to the first semiconductor element 2. FIGS. 14A to 14C show a production process of the semiconductor device 20 adopting the first and second metal circuit boards 22, 24.

As in the previously-described first embodiment, the first metal circuit board 22 is provided with the first die pad portion 12 having a reduced thickness portion being the metal board reduced by the half-etching, coining, or the like. To the first die pad portion 12, the first semiconductor element 2 is bonded via the adhesive layer 14. Further, the first metal circuit board 22 has the second connection terminal 21 being reduced in thickness by the half-etching, coining, or the like from the same direction as of the first die pad portion 12. The second connection terminals 21 is to be connected to the electrode pad 5 of the second semiconductor element 3 and has a structure in which the outside connection terminal and the inside connection terminal are unified.

Meanwhile, the second metal circuit board 24 is provided with the second die pad portion 13 having a reduced thickness portion being the metal board reduced by the half-etching, coining, or the like. To the second die pad portion 13, the second semiconductor element 3 is bonded via the adhesive layer 15. Further, the second metal circuit board 24 is provided with the first connection terminal 23 being reduced in thickness by the half-etching, coining, or the like from the same direction as of the second die pad portion 13. The first connection terminal 23 is connected to the electrode pad 4 of the first semiconductor element 2 and has a structure in which the outside connection terminal and the inside connection terminal are unified. The first and second metal circuit boards 22, 24 are prepared as a lead frame, respectively.

The first and second metal circuit boards 22, 24 are stacked so that the electrode forming surfaces 2a, 3a of the first semiconductor elements 2, 3, face each other, as shown in FIGS. 14A, 14B, 14C. At that time, on the first semiconductor element 2, an insulative die attach resin or the like is arranged as an adhesive layer 6. After that, the first semiconductor element 2 supported by the first die pad portion 12 and the second semiconductor element 3 supported by the second die pad portion 13 are bonded. Subsequently, as shown in FIG. 14B, the wire bonding is performed sequentially to the first and second semiconductor elements 2, 3.

After that, as shown in FIG. 14C, the first and second semiconductor elements 2, 3 and the first and second metal circuit boards 22, 24 are injection molded with a sealing material such as the sealing resin (molding resin) 16 while exposing parts of the respective connection terminals 23, 21. Thus, the semiconductor device 20 according to the second embodiment is manufactured. The semiconductor device 20 has the same structure and effect as of the first embodiment except that the shapes of the first and second connection terminals 23, 21 and the structure of the lead frame (a relation between the die pad portion and the connection terminal and so forth) are different therefrom. Accordingly, it is possible to provide the semiconductor device 20 having a packaging structure of a reduced thickness and allowing the Burn-In test for the effective number of stacked elements in terms of yield.

Figure 15:
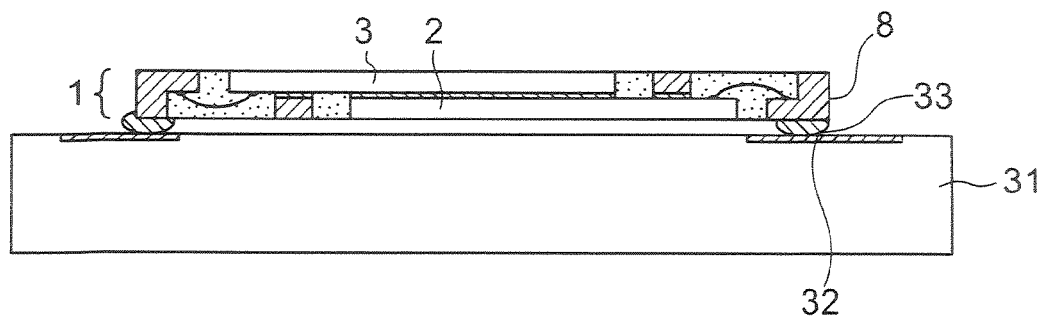
FIG. 15 is a sectional view showing a state where the semiconductor device according to the embodiment of the present invention is mounted on a mounting board.

The above-described semiconductor devices 1, 20 according to the first and second embodiments can be used directly as a semiconductor package, respectively. FIG. 15 to FIG. 18 show a circuit device in which the semiconductor device 1 (or 20) according to the previously-described embodiment is used as a semiconductor package and directly mounted on a mounting board 31. FIG. 15 shows a state where a single semiconductor device 1 is mounted on the mounting board 31. The outside connection terminal 8 of the semiconductor device 1 and a mounting pad 32 of the mounting board 31 are connected via a connection material 33. For the connection material 33, a conductive material such as a solder ball, solder paste, or the like is used. Thus, the semiconductor device 1 can be directly mounted on the mounting board 31 as a package in which two semiconductor elements 2, 3 are stacked.

Figure 16:
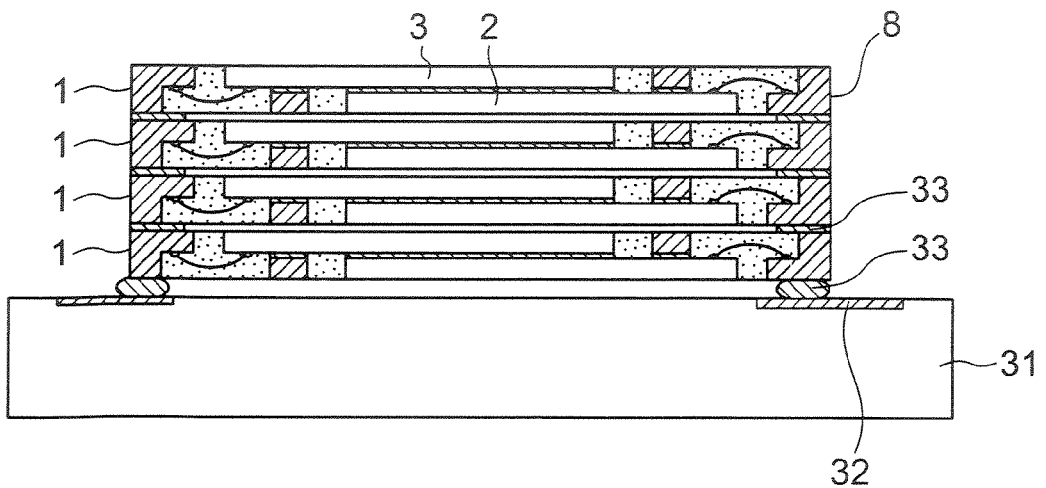
FIG. 16 is a sectional view showing another state where the semiconductor device according to the embodiment of the present invention is mounted on the mounting board.
Figure 17:
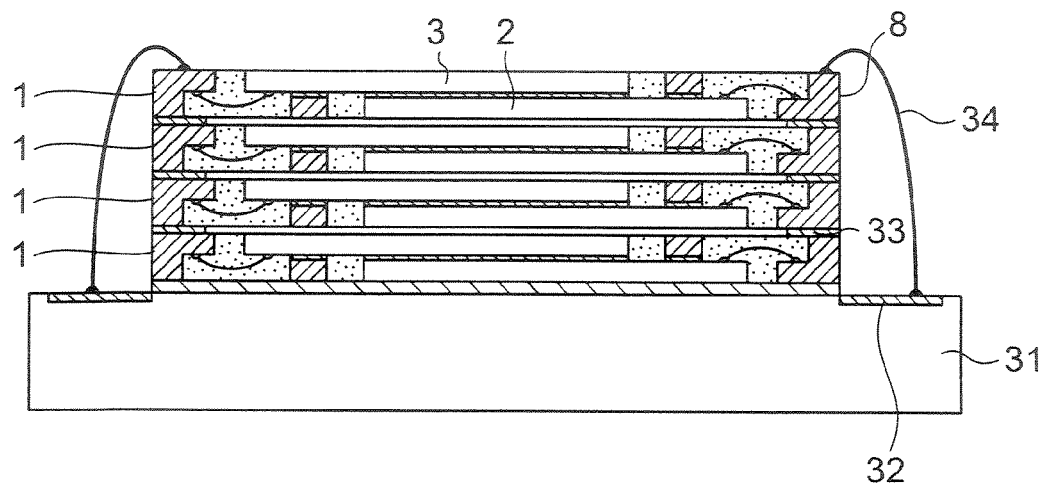
FIG. 17 is a sectional view showing still another state where the semiconductor device according to the embodiment of the present invention is mounted on the mounting board.
Figure 18:
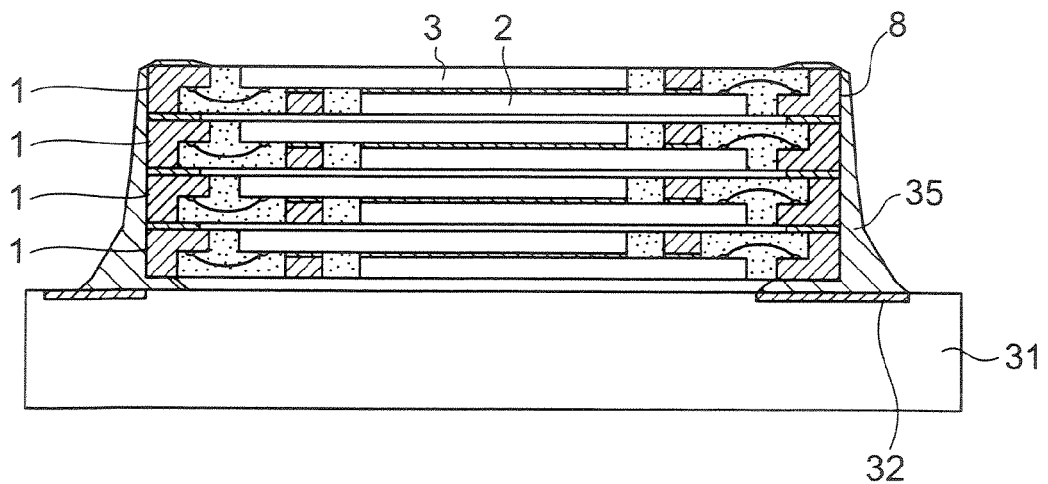
FIG. 18 is a sectional view showing still another state where the semiconductor device according to the embodiment of the present invention is mounted on the mounting board.

The semiconductor device 1 used as a semiconductor package can be mounted plurally on the mounting board 31 by stacking a plurality of semiconductor devices 1, as shown for example in FIGS. 16, 17, 18. FIGS. 16, 17, 18 show a circuit device in which four semiconductor devices 1 are mounted on the mounting board 31, respectively. Note that the number of the stacked semiconductor device(s) 1 is not limited thereto and can be set appropriately. In the circuit device shown in FIG. 16, the outside connection terminals 8 of the respective semiconductor devices 1, and the outside connection terminal 8 of the lowermost semiconductor device 1 and the mounting pad 32 are electrically connected via the connection material 33 such as the solder ball, solder paste, or the like.

In the circuit device shown in FIG. 17, the outside connection terminal 8 of the respective semiconductor devices 1 are electrically connected via the connection material 33 such as the solder ball, solder paste, or the like. In order to connect between the semiconductor device 1 and the mounting pad 32, a bonding wire 34 is used. Specifically, the outside connection terminal 8 of the uppermost semiconductor device 1 and the mounting pad 32 are electrically connected via the bonding wire 34. FIG. 18 shows a structure in which the respective semiconductor devices 1, and the semiconductor device 1 and the mounting pad 32 are connected via a solder 35 in a unified manner. In order to connect between the stacked semiconductor devices 1, and the semiconductor device 1 and the mounting pad 32, a various connection structures are applicable.

Figure 19:
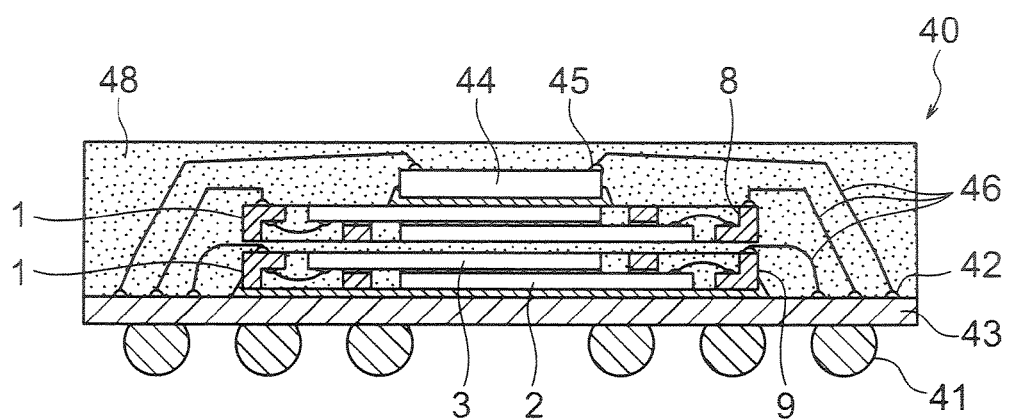
FIG. 19 is a sectional view showing a structure of a semiconductor package using the semiconductor device according to the embodiment of the present invention as a packaging material.
Figure 20:
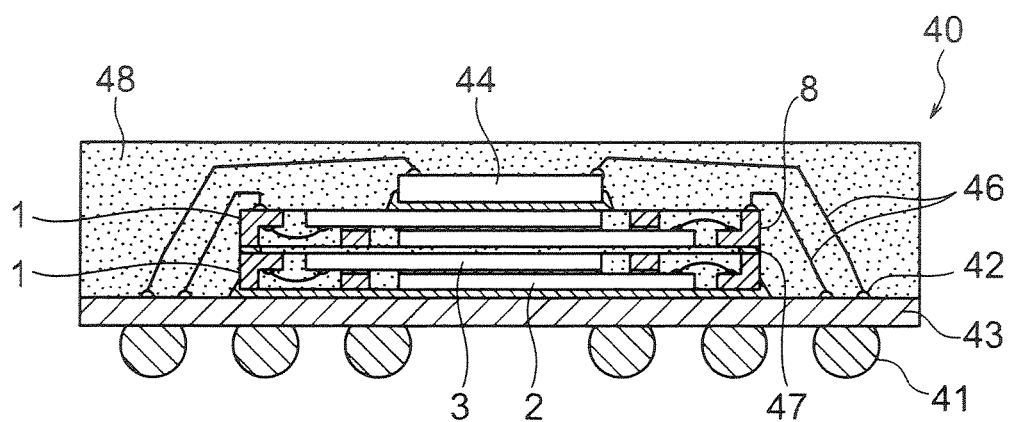
FIG. 20 is a sectional view showing another structure of the semiconductor package using the semiconductor device according to the embodiment of the present invention as a packaging material.

The semiconductor devices 1, 2 according to the first and second embodiments can be mounted on a package base such as a wiring substrate, a lead frame, or the like, as a packaging material, respectively, to thereby compose a semiconductor package, in addition to that they are directly used as a semiconductor package FIGS. 19 and 20 show a semiconductor package using the semiconductor device 1 (or 20) as a package material. A semiconductor package 40 shown in FIGS. 19 and 20 has a structure in which two semiconductor devices 1 are stacked and mounted on a wiring substrate 43 having solder balls 41 on one main surface thereof as mounting terminals and connection pads 42 on the other main surface thereof. Note that the number of the stacked semiconductor device(s) 1 is not limited thereto and can be set appropriately.

When the semiconductor elements 2, 3 composing the respective semiconductor devices 1 are, for example, NAND type flash memories, the semiconductor devices 1 can further mount a controller element 44 thereon. In the semiconductor package 40 shown in FIG. 19, the connection pad 42 of the wiring substrate 43 and the outside connection terminal 8 of the semiconductor device 1, and the connection pad 42 of the wiring substrate 43 and an electrode pad 45 of the controller element 44 are connected via a bonding wire 46, respectively. In the semiconductor package 40 shown in FIG. 20, the outside connection terminals 8 of the stacked semiconductor devices 1 are connected via a connection material 47 such as a solder paste, and further, the outside connection terminal 8 of the uppermost semiconductor device 1 is connected to the connection pad 42 via a bonding wire 46.

According to the semiconductor package 40 as described above, the thickness required to bond the semiconductor devices 1 can be reduced in addition to that the thickness of the semiconductor device 1 itself is reduced, allowing the entire package to be reduced in thickness. Furthermore, the semiconductor package 40 allows the Burn-In test to be performed with respect to the semiconductor device 1 beforehand, allowing the semiconductor package 40 to be improved in yield. In FIGS. 19 and 20, the plurality of semiconductor devices 1 are all sealed at once with a sealing material such as a sealing resin 48.

Note that the present invention is not limited to the above-described respective embodiments, and it is applicable to a semiconductor device of various shapes in which two semiconductor elements are stacked while their electrode forming surfaces facing each other, various stacked semiconductor packages configured by mounting such a semiconductor device on the package base, and further various circuit devices mounting the semiconductor device on a mounting board. Such a semiconductor device, a semiconductor package and a circuit device are also within the scope of the present invention. The embodiments according to the present invention can be extended or modified within the scope of the technical idea of the present invention, and the extension and the modification are also within the technical scope of the present invention.

What is claimed is:

1. A semiconductor device, comprising:
   a first semiconductor element including an electrode forming surface having a first electrode pad thereon;
   a second semiconductor element including an electrode forming surface having a second electrode pad thereon, the electrode forming surface of the second semiconductor element bonding to the electrode forming surface of the first semiconductor element via an adhesive layer so that the first and second electrode pads expose, respectively;
   a metal circuit board having a first connection terminal and a second connection terminal arranged outside the first and second semiconductor elements, the first connection terminal connecting to the first electrode pad via a first bonding wire and the second connection terminal connecting to the second electrode pad via a second bonding wire; and
   a sealing material sealing the first and second semiconductor elements and the metal circuit board so that parts of the first and second connection terminals expose, wherein
   the first and second connection terminals each have,
      an outside connection terminal of a thickness substantially corresponding to a total thickness of the first and second semiconductor elements, and
      an inside connection terminal formed continuously from the outside connection terminal, the inside connection terminal having a thickness thinner than the thickness of the outside connection terminal, and
   the first and second bonding wires are accommodated within the total thickness of the first and second semiconductor elements.

2. The semiconductor device as set forth in claim 1, wherein,
   the first and second connection terminals each have a stepped shape partially reducing a thickness of the metal circuit board,
   the outside connection terminal is provided at a portion of each of the first and second connection terminals having the original thickness of the stepped shape, and
   the inside connection terminal is provided at a portion of each of the first and second connection terminals having the reduced thickness of the stepped shape.

3. The semiconductor device as set forth in claim 2, wherein the stepped shape constituted the first and second connection terminals has a terrace portion, and the first connection terminal and the second connection terminal are arranged to orient the terrace portions opposite to each other.

4. The semiconductor device as set forth in claim 1, wherein the metal circuit board includes a first die pad portion supporting the electrode forming surface of the first semiconductor element and a second die pad portion supporting the electrode forming surface of the second semiconductor element.

5. The semiconductor device as set forth in claim 4, wherein at least one of the first die pad portion and the second die pad portion has an L-shape.

6. A semiconductor package, comprising:
   a package base including a semiconductor device mounting portion, connection pads arranged around the semiconductor device mounting portion, and mounting terminals electrically connected to the connection pads;
   a first semiconductor device as set forth in claim 1, mounted on the mounting portion of the package base;
   a second semiconductor device as set forth in claim 1, stacked on the first semiconductor device;
   a first connection portion electrically connecting the connection pads of the package base and the first and second connection terminals of the semiconductor device, or the first and second connection terminals of the first semiconductor device and the first and second connection terminals of the second semiconductor device;
   a second connection portion electrically connecting the connection pads of the package base and the first and second connection terminals in the second semiconductor device; and
   a second sealing material sealing the first and second semiconductor devices.

7. The semiconductor package as set forth in claim 6,
   wherein the first connection portion includes bonding wires electrically connecting the connection terminals of the first semiconductor device and the connection pads of the package base, and
   the second connection portion includes bonding wires electrically connecting the connection terminals of the second semiconductor device and the connection pads of the package base.

8. The semiconductor package as set forth in claim 6,
   wherein the first connection portion includes a conductive connection material electrically connecting between the connection terminals of the first semiconductor device and the connection terminals of the second semiconductor device, and
   the second connection portion includes bonding wires electrically connecting the connection terminals of the second semiconductor device and the connection pads of the package base.

9. The semiconductor package as set forth in claim 6, wherein,
   the first and second connection terminals of the first and second semiconductor devices each have a stepped shape partially reducing a thickness of the metal circuit board,
   the outside connection terminal is provided at a portion of each of the first and second connection terminals of each of the first and second semiconductor devices having the original thickness of the stepped shape, and
   the inside connection terminal is provided at a portion of each of the first and second connection terminals of each of the first and second semiconductor devices having the reduced thickness of the stepped shape.

10. The semiconductor package as set forth in claim 6, wherein the metal circuit boards of the first and second semiconductor devices include a first die pad portion supporting the electrode forming surface of the first semiconductor element and a second die pad portion supporting the electrode forming surface of the second semiconductor element.

11. A circuit device, comprising:
a mounting board including mounting pads;
a semiconductor device as set forth in claim 1, mounted on the mounting board, and
a connection portion electrically connecting the mounting pads of the mounting board and the first and second connection terminals of the semiconductor device.

12. The circuit device as set forth in claim 11, wherein the circuit device includes a plurality of the semiconductor devices, the semiconductor devices being stacked and mounted on the mounting board.

13. The circuit device as set forth in claim 12, wherein the connection terminals of the plurality of semiconductor devices, and the connection terminals of the lowermost semiconductor device and the mounting pads are respectively connected via a conductive connection material.

14. The circuit device as set forth in claim 12,
wherein the connection terminals of the plurality of semiconductor devices are respectively connected via a conductive connection material, and
the connection terminals of the uppermost semiconductor device and the mounting pads are connected via bonding wires.

15. A semiconductor device, comprising:
a first semiconductor element including an electrode forming surface having a first electrode pad thereon;
a second semiconductor element including an electrode forming surface having a second electrode pad thereon, the electrode forming surface of the second semiconductor element bonding to the electrode forming surface of the first semiconductor element via an adhesive layer so that the first and second electrode pads expose, respectively;
a metal circuit board having a first connection terminal and a second connection terminal arranged outside the first and second semiconductor elements, the first connection terminal connecting to the first electrode pad via a first bonding wire and the second connection terminal connecting to the second electrode pad via a second bonding wire; and
a sealing material sealing the first and second semiconductor elements and the metal circuit board so that parts of the first and second connection terminals expose,
wherein the metal circuit board includes a first metal circuit board having a first die pad portion bonded to the electrode forming surface of the first semiconductor element and the second connection terminal, and a second metal circuit board having a second die pad portion bonded to the electrode forming surface of the second semiconductor element and the first connection terminal,
wherein a total thickness of the first and second metal circuit board is about equivalent to a total thickness of the first and second semiconductor elements, the first and second die pad portions are disposed in the total thickness of the first and second semiconductor elements, and the first and second bonding wires are accommodated within the total thickness of the first and second semiconductor elements.

16. A circuit device, comprising:
a mounting board including mounting pads;
a plurality of semiconductor devices stacked and mounted on the mounting board, wherein each of the semiconductor devices comprises:
a first semiconductor element including an electrode forming surface having a first electrode pad thereon,
a second semiconductor element including an electrode forming surface having a second electrode pad thereon, the electrode forming surface of the second semiconductor element bonding to the electrode forming surface of the first semiconductor element via an adhesive layer so that the first and second electrode pads expose, respectively,
a metal circuit board having a first connection terminal and a second connection terminal arranged outside the first and second semiconductor elements, the first connection terminal connecting to the first electrode pad via a first bonding wire and the second connection terminal connecting to the second electrode pad via a second bonding wire, and
a sealing material sealing the first and second semiconductor elements and the metal circuit board so that parts of the first and second connection terminals expose; and
a connection portion electrically connecting the mounting pads of the mounting board and the first and second connection terminals of the semiconductor device,
wherein the connection terminals of the semiconductor devices are respectively connected via a conductive connection material, and the connection terminals of the uppermost semiconductor device and the mounting pads are connected via bonding wires.

* * * * *